(12) United States Patent
Lin et al.

(10) Patent No.: US 11,450,660 B2
(45) Date of Patent: Sep. 20, 2022

(54) SEMICONDUCTOR DEVICE AND METHOD OF FABRICATING THE SAME

(71) Applicant: Taiwan Semiconductor Manufacturing Co., Ltd., Hsinchu (TW)

(72) Inventors: Meng-Han Lin, Hsinchu (TW); Te-An Chen, Taichung (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 53 days.

(21) Appl. No.: 16/859,992

(22) Filed: Apr. 27, 2020

(65) Prior Publication Data
US 2021/0335782 A1    Oct. 28, 2021

(51) Int. Cl.
| | | |
|---|---|---|
| *H01L 29/76* | (2006.01) | |
| *H01L 29/94* | (2006.01) | |
| *H01L 27/088* | (2006.01) | |
| *H01L 29/06* | (2006.01) | |
| *H01L 21/8234* | (2006.01) | |
| *H01L 29/66* | (2006.01) | |
| *H01L 29/423* | (2006.01) | |

(52) U.S. Cl.
CPC .... *H01L 27/088* (2013.01); *H01L 21/823462* (2013.01); *H01L 21/823481* (2013.01); *H01L 29/0649* (2013.01); *H01L 29/42368* (2013.01); *H01L 29/66545* (2013.01)

(58) Field of Classification Search
CPC ........... H01L 21/823462; H01L 27/088; H01L 29/0649; H01L 29/42368; H01L 29/66545

USPC ......................................................... 257/392
See application file for complete search history.

(56) References Cited

U.S. PATENT DOCUMENTS

| | | | |
|---|---|---|---|
| 5,726,479 A * | 3/1998 | Matsumoto | ......... H01L 29/4933 257/388 |
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,520,482 B1 | 12/2016 | Chang et al. | |
| 9,576,814 B2 | 2/2017 | Wu et al. | |
| 2003/0025135 A1* | 2/2003 | Matsumoto | ............. H01L 21/84 257/288 |
| 2009/0078997 A1* | 3/2009 | Greene | ............... H01L 27/1211 257/E21.294 |

(Continued)

*Primary Examiner* — Theresa T Doan
(74) *Attorney, Agent, or Firm* — JCIPRNET

(57) ABSTRACT

Provided is a semiconductor device including a substrate, an isolation structure, a gate dielectric layer, a high-k dielectric layer, and a protection cap. The substrate includes a first region, a second region, and a transition region located between the first region and the second region. The isolation structure, located in the transition region. The gate dielectric layer is located on the isolation structure. The high-k dielectric layer is located on the isolation structure and extended to cover a sidewall and a surface of the gate dielectric layer. The protection cap is located on a surface and sidewalls of the high-k dielectric layer.

20 Claims, 15 Drawing Sheets

(56) References Cited

U.S. PATENT DOCUMENTS

2013/0234244 A1* 9/2013 Liu .................. H01L 29/51
257/334

* cited by examiner

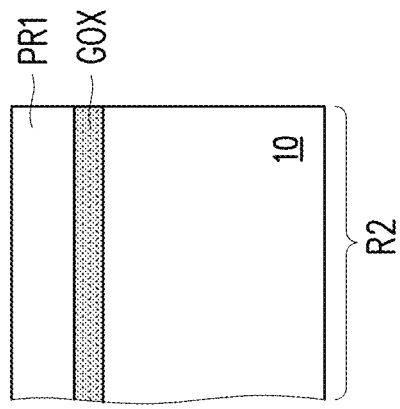
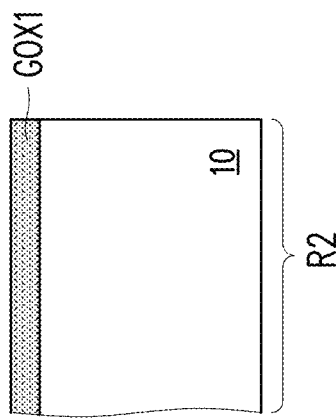
FIG. 3A
FIG. 3B

SEMICONDUCTOR DEVICE AND METHOD OF FABRICATING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (e.g., the number of interconnected devices per chip area) has generally increased while geometry size (e.g., the smallest component (or line) that can be created using a fabrication process) has decreased. This scaling down process generally provides benefits by increasing production efficiency and lowering associated costs. However, scaling down has also led to challenges that may not have been presented by previous generations at larger geometries.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A to 3M schematically illustrate a method of fabricating a semiconductor device in accordance with some embodiments of the present disclosure.

DETAILED DESCRIPTION

Figure 1A:
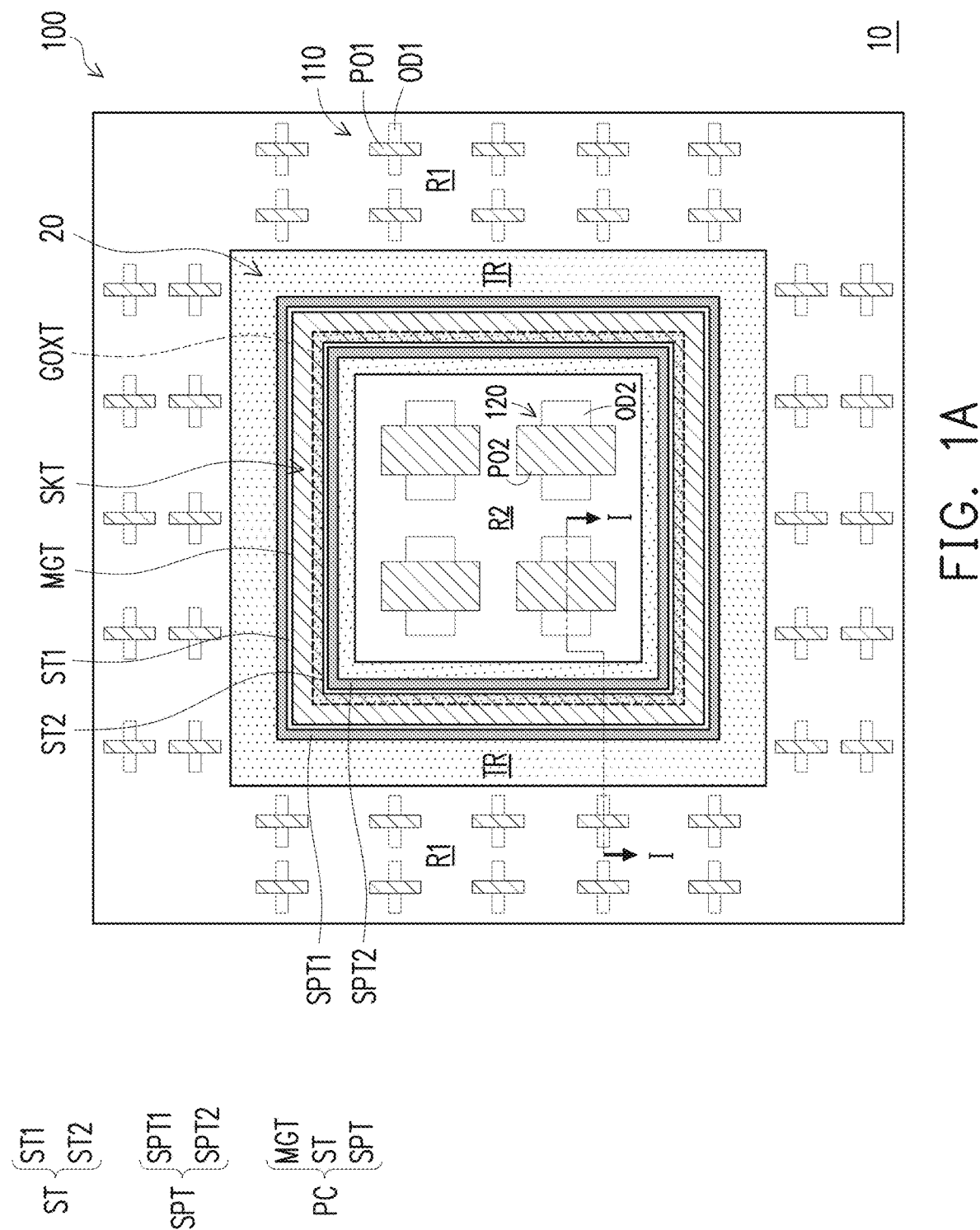
FIGS. 1A and 1B schematically illustrate a plan views of semiconductor devices in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Semiconductor devices may include devices having different threshold voltages. During manufacturing the semiconductor device, a thick gate dielectric layer for a high threshold voltage device may remain in the transition region between a high threshold voltage device region and a low threshold voltage device region. The subsequently formed thick high-k dielectric layer may leave on a sidewall of the thick gate dielectric layer in the transition region, thus causing contamination. In the present embodiment, the high-k dielectric layer is covered by a protection cap so that the high-k dielectric layer is sealed. Therefore, the problem of high-k dielectric layer contamination can be avoided.

Figure 1B:
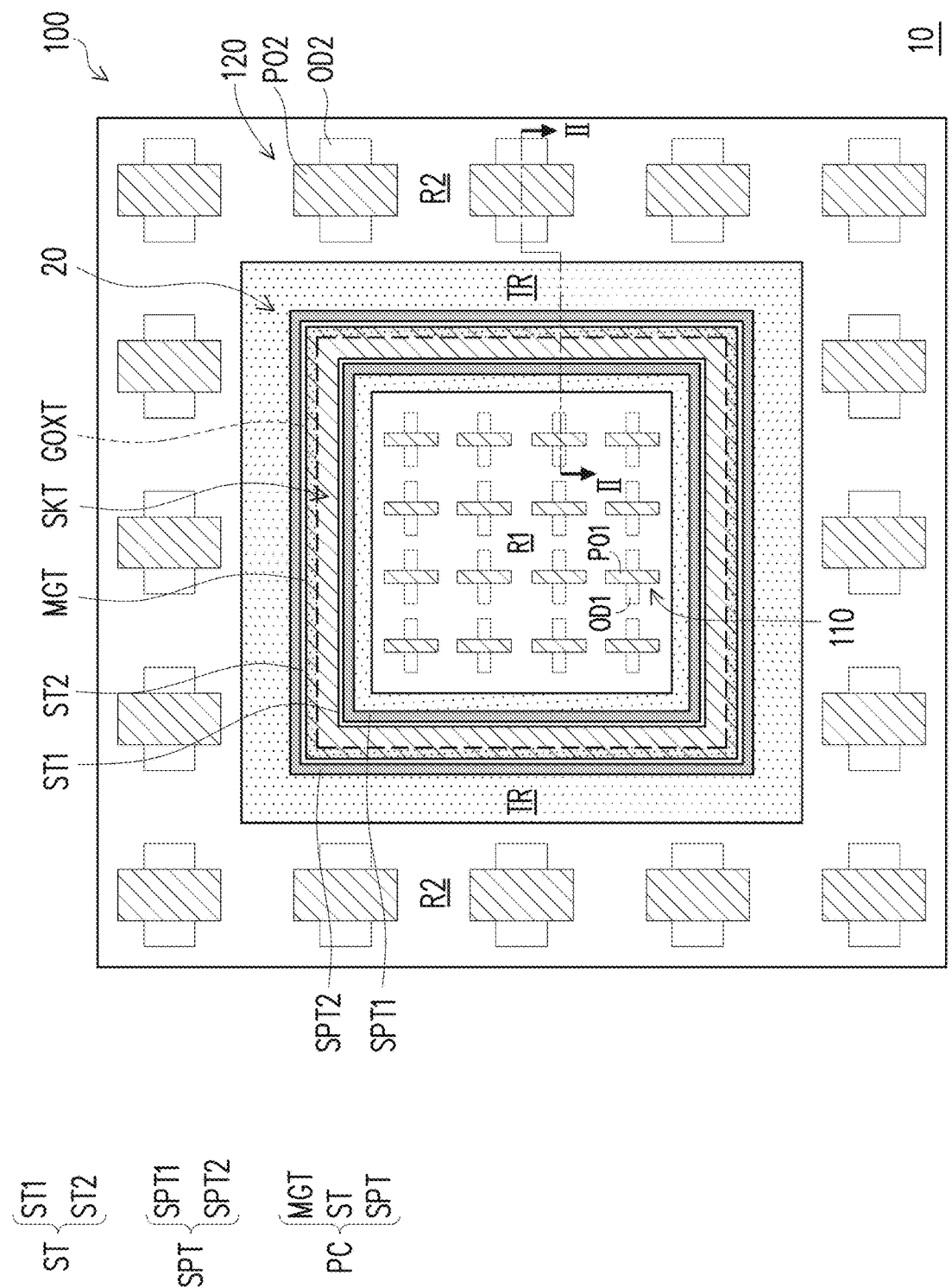
Figure 2:
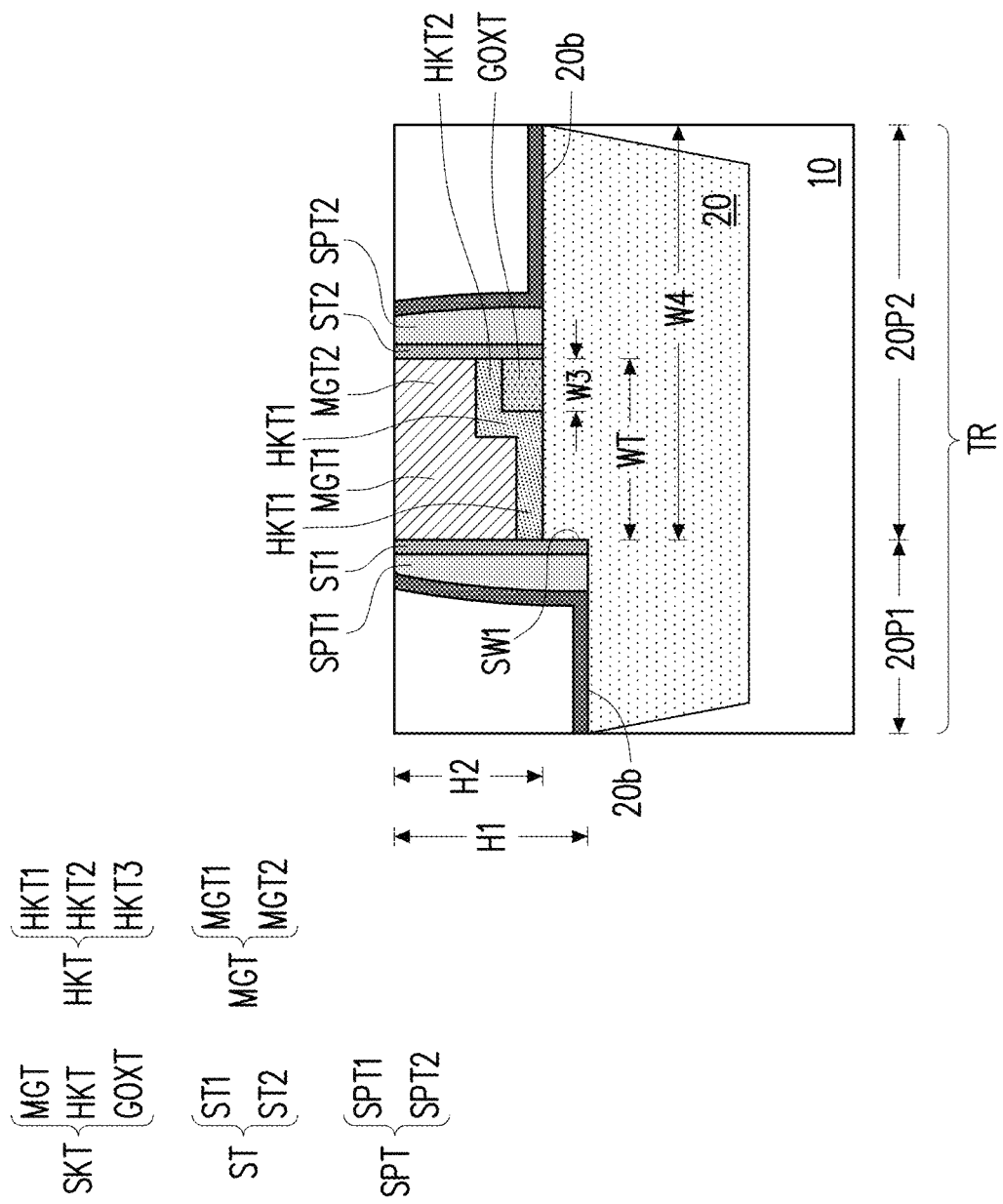
FIG. 2 schematically illustrates a cross-sectional view of a semiconductor device taken along a line I-I in FIG. 1A or a line II-II in FIG. 1B.

FIGS. 1A and 1B schematically illustrate plan views of semiconductor devices in accordance with some embodiments. FIG. 2 schematically illustrates a cross-sectional view of a semiconductor device taken along a line I-I in FIG. 1A or a line II-II in FIG. 1B. Referring to FIGS. 1A, 1B, and 2, a semiconductor device 100 may include a substrate 10, first devices 110, second devices 120, and a stacked structure SKT. The substrate 10 includes a first region R1, a second region R2, and a transition region TR between the first region R1 and the second region R2. In some embodiments, the first region R1 surrounds the second region R2, as shown in FIG. 1A. In other some embodiments, the second region R2 surrounds the first region R1, as shown in FIG. 1B. In some embodiments, the first region R1 is a core region, and the second region R2 is a height voltage device region. In other some embodiments, the first region R1 is a low voltage device region, and the second region R2 is a height voltage device region. The first region R1 OD1 surrounded by isolation structures, and the second region R2 include isolation structures and active regions OD2 surrounded by isolation structures. In some embodiments, a gate electrode PO1 of the first device 110 may be formed in a single active region OD1 within the first region R1, and a gate electrode PO2 of the second device 120 may be formed in a single active region OD2 within the second region R2. In other some embodiments, a gate electrode PO1 of the first device 110 or a gate electrode PO2 of the second device 120 may be formed in more than one active region OD1 or OD2 across at least one of the isolation structures within the first region R1 or the second region R2 (not shown).

In some embodiments, the semiconductor device 100 may be an integrated circuit device typically provided in chip form and may be encapsulated in a package. The semiconductor device 100 may include more or less transistors while the first devices 110 and the second devices 120 are illustrated as examples without the intention of limiting the numbers of the transistors in the semiconductor device 100. In the semiconductor device 100, thousands, or more, transistors may be interconnected. In some embodiments, the first devices 110 and the second devices 120 may have different device characteristics and thus be able to provide various functions. For example, the first devices 110 and the second devices 120 have different threshold voltages. In some embodiments, the second devices 120 has threshold voltages higher than threshold voltages of the first devices 110. In accordance with some embodiments, the second devices 120 are height voltage devices, and the first devices 110 are low voltage devices. In accordance with other some embodiments, the second devices 120 are height voltage devices, and the first devices 110 are core devices. The first devices 110 and the second devices 120 may each be p-type transistors or n-type transistors. In accordance with some embodiments, one or more n-type transistor in the semiconductor device 100 may be interconnected with one or more p-type transistor, for example, by sharing a common gate structure, or may be connected by metal contacts (not shown).

The transition region TR is located at the boundary between the first region R1 and the second region R2. Therefore, the transition region TR may also be referred to as a boundary region. The transition region TR has an isolation structure 20 formed in the substrate 10, and does not include any active region therein. The stacked structure SKT is disposed on the isolation structure 20 within the transition region TR. The isolation structure 20 in the transition region TR includes portions 20P1 and 20P2 connected each other. The portion 20P1 is closer to the first region R1 than the portion 20P2, and the portion 20P2 is closer to the second region R2 than the portion 20P1. The portion 20P2 protrudes from a top surface of the portion 20P1, and a sidewall SW1 of the portion 20P2 is exposed. A surface 20b of the portion 20P1, the sidewall SW1 and the top surface 20a of the portion 20P2 forms a step.

The stacked structure SKT is located on the portion 20P2 of the isolation structure 20 in the transition region TR. In some embodiments, one of the sidewalls of the stacked structure SKT near to the first region R1 is aligned with the sidewall SW1. A width WT of the stacked structure SKT is smaller than a width W4 of the portion 20P2 of the isolation structure 20. The stacked structure SKT includes a gate dielectric layer GOXT, a high-k dielectric layer HKT, and a metal gate electrode MGT. The high-k dielectric layer HKT covers the gate dielectric layer GOXT and continuously extends to cover the portion 20P2 of the isolation structure 20. The metal gate electrode MGT covers a top surface of the high-k dielectric layer HKT. Seal liners ST and spacers SPT are formed on sidewalls of the stacked structure SKT. The spacers SPT, the seal liners ST, and the metal gate electrode MGT forms a protection cap PC to seal the high-k dielectric layer HKT in the transition region RT.

Referring to FIGS. 1A and 1B, in some embodiments, the top view of the protection cap PC is a ring, such as a rectangular ring, a ring, an oval ring, etc., but is not limited thereto. The protection cap PC is provided on the isolation structure 20 to seal the high-k dielectric layer HKT in the transition region RT. Since there is no active region included in transition region RT, the protection cap PC is not disposed on any active region in the substrate 10.

Referring to FIGS. 1A, 1B and 2, the metal gate electrode MGT of the stacked structure SKT includes a portion MGT1 and a portion MGT2 connected to each other. The high-k dielectric layer HKT includes a portion HKT1, a portion HKT2 and a portion HKT3. The portion HKT3 is located between and connects the portion HKT1 and the portion HKT2. The seal liners ST include a seal liner ST1 and a seal liner ST2. The spacers SPT include a seal liner SPT1 and a seal liner SPT2.

The portion MGT1 of the metal gate electrode MGT covers the portion HKT1 of the high-k dielectric layer HKT, and the portion MGT2 of the metal gate electrode MGT covers the portions HKT2 and HKT3 of high-k dielectric layer HKT. The top surface of the metal gate electrode MGT1 and the top surface of the MGT2 are coplanar, and the bottom surfaces of the portion MGT1 and the portion MGT2 are not coplanar, and have a step.

The high-k dielectric layer HKT and the metal gate electrode MGT have the same width WT, and thus the high-k dielectric layer HKT and the metal gate electrode MGT have a same top surface area. The width WT of the high-k dielectric layer HKT is smaller than the width W4 of the portion 20P2 of the isolation structure 20, and thus a top surface area of the high-k dielectric layer HKT is smaller than a top surface area of the portion 20P2 of the isolation structure 20. The width WT of the high-k dielectric layer HKT is greater than a width W3 of the gate dielectric layer GOXT, and thus the top surface area of the high-k dielectric layer HKT is greater than a top surface area of the gate dielectric layer GOXT.

The portion HKT1 of the high-k dielectric layer HKT is sandwiched between and in direct contact with the top surface 20a of the isolation structure 20 and a bottom surface of the portion MGT1 of the metal gate electrode MGT in the direction of the normal of the substrate 10. A sidewall of the portion HKT1 near to the first region R1 is in direct contact with and sealed by the seal liner ST1.

The portion HKT2 of the high-k dielectric layer HKT is sandwiched between and in direct contact with a top surface of the gate dielectric layer GOXT and a bottom surface of the portion MGT2 of the metal gate electrode MGT in the direction of the normal of the substrate 10. A sidewall of the portion HKT2 near to the second region R2 is in direct contact with and sealed by the seal liner ST2.

The portion HKT3 of the high-k dielectric layer HKT connects the portion HKT1 and the portion HKT2. The portion HKT3 is located on and is in direct contact with the sidewall of the gate dielectric layer GOXT. The portion HKT3 is sandwiched between the top surface 20a of the isolation structure 20 and the bottom surface of portion MGT2 of the metal gate electrode MGT in the direction of the normal of the substrate 10. A top surface of the portion HKT3 is coplanar with a top surface of the portion HKT2. A bottom surface of portion HKT3 is coplanar with the bottom surface of portion HKT1 and a bottom surface of gate dielectric layer GOXT.

The sealed liners S1 or the spacers SP1 at the two sidewalls of the stacked structure SK1 in the first region R1 are substantially symmetrical. The sealed liners S2 or the spacers SP2 at the two sidewalls of the stacked structure SK2 in the second region R2 are substantially symmetrical. The sealed liners ST1 or ST2 and the spacers SPT1 and SPT2 at the two sidewalls of the stacked structure SKT in the transition region RT are asymmetric. The symmetry or asymmetry herein may refer to a symmetry or an asymmetry in shape, height, or width.

A bottom surface of the seal liner ST1 and a bottom surface of the spacer SPT1 are substantially coplanar, and a bottom surface of the seal liner ST2, a bottom surface of the spacer SPT2, and a bottom surface of the stacked structure SKT (i.e., bottom surfaces of the gate dielectric layer GOXT and the portions HKT1, HKT2 and HKT3 of the high-k dielectric layer HKT) are substantially coplanar. The bottom surfaces of the seal liner ST1 and the spacer SPT1 are lower than the bottom surfaces of the seal liner ST2, the spacer SPT2 and the stacked structure SKT in some embodiments.

The seal liner ST2 and the spacer SPT2 are located on the sidewall of the stacked structure SKT near to the second region R2, covering the portion MGT2 of the metal gate electrode MGT2, the portion HKT2 of the high-k dielectric layer HKT, and the sidewall of the gate dielectric layer GOXT. The seal liner ST1 and the spacer SPT1 in the transition region RT are not only located on the sidewall of the stacked structure SKT near to the first region R1, covering the portion MGT1 of the metal gate electrode MGT and the portion HKT1 of the high-k dielectric layer HKT, but also covering the sidewall SW1 of the portion 20P2 of the isolation structure 20. Therefore, a height H1 of the seal liner ST1 and the spacer SPT1 is greater than a height H2 of the seal liner ST2 and the spacer SPT2.

Referring to FIG. 3A, a substrate 10 is provided. The substrate 10 may be a bulk semiconductor substrate such as a bulk silicon wafer. The term "substrate" may be used to refer to just the semiconductor substrate or a semiconductor substrate inclusive of isolation regions. The substrate 10 may be or include any silicon-containing substrate including, but not limited to, single crystal Si, polycrystalline Si, amorphous Si, or Si-on-insulator (SOI) substrates and the like, and may be n-type or p-type doped as desired for a particular application. The substrate 10 may also include other semiconductors such as germanium, silicon carbide (SiC), silicon germanium (SiGe), or diamond.

Alternatively, the substrate 10 may include a compound semiconductor and/or an alloy semiconductor. Further, in some embodiments, the substrate 10 may include an epitaxial layer (epi-layer). The substrate 10 may have one or more fin or fin-like structures for constructing the transistors such as the first device 110 and the second device 120. The first device 110 and the second device 120 may be fin type field effect transistors (Fin FETs).

The substrate 10 includes a first region R1, a second region R2, and a transition region TR between the first region R1 and the second region R2. In some embodiments, the transition region TR surrounds the second region R2, as shown in FIG. 1A. In other some embodiments, the transition region TR surrounds the first region R1, as shown in FIG. 1B. In some embodiments, the first region R1 is a core region, and the second region R2 is a height voltage device region. In other some embodiments, the first region R1 is a low voltage device region, and the second region R2 is a height voltage device region.

An isolation structure 20 is formed in the substrate 10 in the transition region TR. The isolation structure 20 may be a shallow trench isolation (ST1). To form the isolation structure 20, a mask layer including a silicon oxide layer and a silicon nitride layer is formed on the substrate 10, and the mask layer is patterned by lithography and etching operations. Then, by using the patterned mask layer as an etching mask, the substrate 10 is etched to form a trench. A depth of the trench is in a range from about 50 nm to about 1 μm in some embodiments. The trench is filled with an insulating (dielectric) material such as silicon oxides, silicon nitrides, silicon carbides, fluorosilicate glass (FSG), low-K dielectric materials, and/or other suitable insulating materials. The insulating material may be deposited by any suitable technique including thermal growth, flowable CVD (FCVD), HDP-CVD, physical vapor deposition (PVD), ALD, and/or spin-on techniques. A planarization operation, such as CMP or an etch-back process, is performed so as to remove an upper part of the insulating material layer, thereby forming the isolation structure 20. In some embodiments, the entire surface of the transition region TR is etched, and the isolation structure 20 occupies the entire surface of the transition region TR, and thus the substrate 10 is free from any active region in the transition region TR.

Another isolation structures such as shallow trench isolations (not shown) are also formed in the substrate 10 in the first region R1 and the second region R2. Depths of another isolation structures in the first region R1 and the second region R2 are less than the depth of the isolation structure 20 in the transition region TR in some embodiments. The substrate 10 not etched in the first region R1 and the second region R2, and surrounded or separated by shallow trench isolations (STIs) made of insulating material, such as silicon oxide, is active regions, over which transistors or other semiconductor devices are formed.

The substrate 10 may include various doping configurations depending on design requirements as is known in the art. For example, different doping profiles (e.g., p-well, n-well) may be formed on the substrate 10 in the first region R1 or second region R2 designed for different device types (e.g., n-type field effect transistors (NFET), p-type field effect transistors (PFET)). The suitable doping may include ion implantation of dopants and/or diffusion processes, such as boron (B) for the p-well and phosphorous (P) for the n-well.

A gate dielectric material layer GOX is formed on a first region R1, a transition region TR, and a second region R2 of a substrate 10. The gate dielectric material layer GOX on the first region R1, the transition region TR, and the second region R2 has a substantially uniform thickness. The material of the gate dielectric material layer GOX is, for example, silicon oxide. The gate dielectric material layer GOX may be formed by any suitable technique including thermal growth, chemical vapor deposition (CVD), including low pressure CVD (LPCVD) and plasma enhanced CVD (PECVD), atomic layer deposition (ALD), or other suitable process.

A mask layer PR1 is formed on the substrate 10 to partially cover the gate dielectric material layer GOX on the substrate 10 in the second region R2 and on a portion SR2 of the isolation structure 20 in the transition region TR, and expose the gate dielectric material layer GOX on the substrate 10 in the first region R1 and on a portion SR1 of the isolation structure 20 in the transition region TR. The mask layer PR1 is, for example, a photoresist pattern.

Referring to FIG. 3B, using the mask layer PR1 as a mask, the gate dielectric material layer GOX not covered by the mask layer PR1 is removed, leaving the gate dielectric layer GOX1. The method of removing the non-masked layer PR1 may use an etching process. The etching process may be anisotropic etching, isotropic etching, or a combination thereof. After that, the mask layer PR1 may be removed by an acceptable ashing or stripping process, such as using an oxygen plasma or the like, for example. The gate dielectric layer GOX1 is located on the substrate 10 in the second region R2 and on the portion SR2 of the isolation structure 20 in the transition region TR. A top surface of the gate dielectric layer GOX1 on the portion SR2 of the isolation structure 20 and a top surface of the portion SR1 of the isolation structure 20 have a step.

Figure 3C:
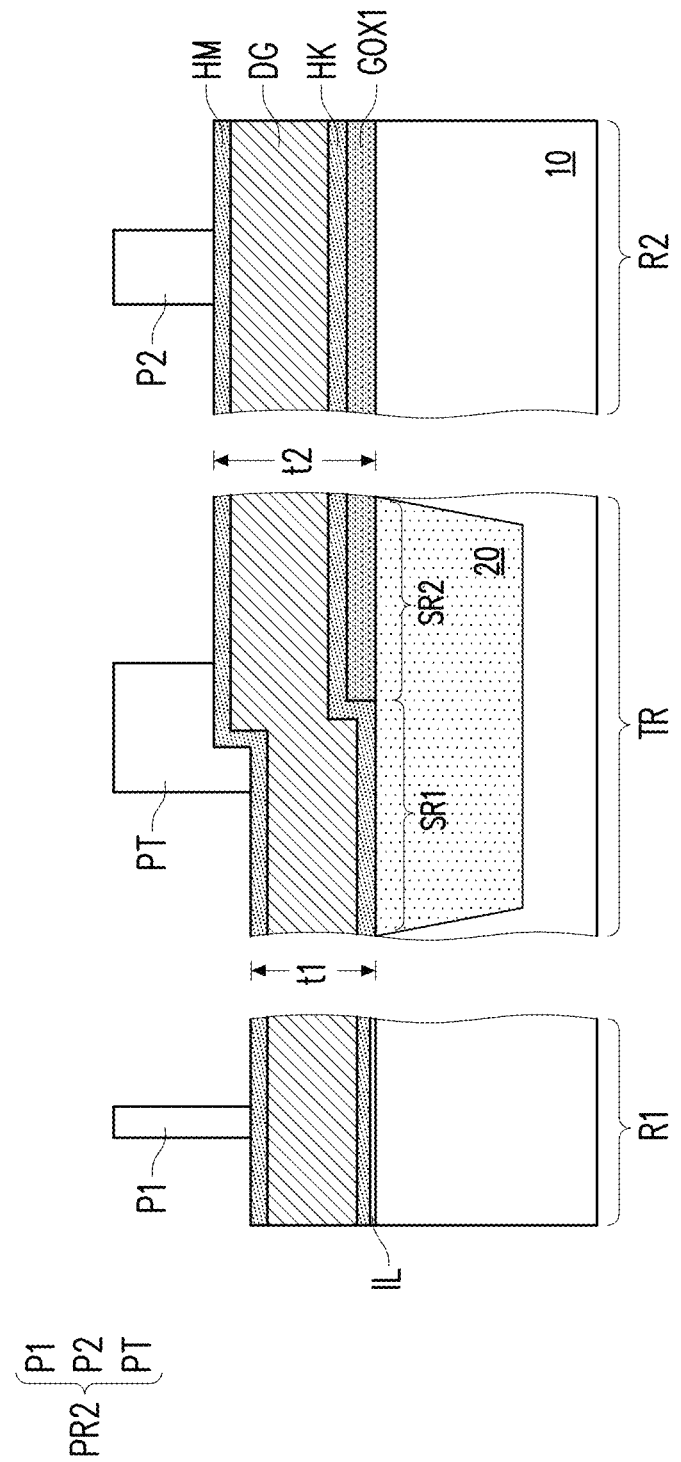

Referring to FIG. 3C, an insulating material layer IL is formed on the substrate 10 in the first region R1. A thickness of the insulating material layer IL is smaller than a thickness of the gate dielectric layer GOX1. The insulating material layer IL may be deposited or thermally grown respectively on the substrate 10 according to acceptable techniques, and made of, for example, silicon dioxide, a low-k dielectric material (e.g., a material having a dielectric constant lower than silicon dioxide), silicon oxynitride, phosphosilicate glass (PSG), borosilicate glass (BSG), borophosphosilicate glass (BPSG), undoped silicate glass (USG), fluorinated silicate glass (FSG), organosilicate glasses (OSG), $SiO_xC_y$, Spin-On-Glass, Spin-On-Polymers, silicon carbon material, a compound thereof, a composite thereof, the like, or a combination thereof.

A high-k dielectric layer HK is formed in the first region R1, the transition region TR, and the second region R2. The high-k dielectric layer HK covers the insulating material layer IL in the first region R1, the portion SR1 of the isolation structure 20 and a sidewall and the top surface of the gate dielectric layer GOX1 in the transition region TR, and the gate dielectric layer GOX1 in the second region R2. A sacrificial gate layer DG is formed on the high-k dielectric layer HK, and a hard mask layer HM is formed on the sacrificial gate layer DG in the first region R1, the transition region TR, and the second region R2.

The formation methods of the high-k dielectric layer HK may include MBD, ALD, PECVD, and the like. The high-k dielectric layer HK may have a dielectric constant greater than, for example, about 3.9 (the dielectric constant of silicon dioxide) or greater than about 7.0, and be made of, but not limited to, a metal oxide or a silicate of Hf, Al, Zr, La, Mg, Ba, Ti, Pb, and combinations thereof. Alternatively, the high-k dielectric layer HK may include other high-k dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$(BST), $Al_2O_3$, $Si_3N_4$, oxynitrides (SiON), combinations thereof, or other suitable material.

The sacrificial gate layer DG are formed by blanket depositing a sacrificial gate material layer over the high-k dielectric layer HK, and then the sacrificial gate material layer is subjected to a planarization operation in accordance with some embodiments. The sacrificial gate layer DG includes silicon such as polycrystalline silicon or amorphous silicon. The sacrificial gate material layer is deposited using CVD, including LPCVD and PECVD, PVD, ALD, or other suitable process.

The hard mask layer HM may be a single layer or multiple layers. The material of the hard mask layer HM is, for example, silicon nitride (SiN), silicon oxynitride (SiON), silicon oxide (SiO), silicon carbide (SiC), silicon carbonitride (SiCN), silicon carbon oxynitride (SiCON), or a combination thereof. The method for forming the sealing layer is, for example, CVD, FCVD, PVD, ALD, or a combination thereof.

Since the portion SR1 of the isolation structure 20 is not covered by the gate dielectric layer GOX1, and the portion SR2 of the isolation structure 20 in the transition region TR is covered by the gate dielectric layer GOX1. Therefore, a total thickness t1 of stacked layers (including the high-k dielectric layer HK, the sacrificial gate layer DG, and the hard mask layer HM) on the portion SR1 of the isolation structure 20 is smaller than a total thickness t2 of stacked layers (including the gate dielectric layer GOX1, the high-k dielectric layer HK, the sacrificial gate layer DG, and the hard mask layer HM)) on the portion SR2 of the isolation structure 20. The thickness t1 refers to a distance between a top surface of the hard mask layer HM on the portion SR1 and the top surface 20a of the isolation structure 20. The thickness t2 refers to a distance between the top surface of the hard mask layer HM on the portion SR2 and the top surface 20a of the isolation structure 20.

Referring to FIG. 3C, a mask layer PR2 is formed on the substrate 10. The mask layer PR2 is, for example, a photoresist pattern. The mask layer PR2 includes mask patterns P1, P2, and PT to partially covers the hard mask layer HM in the first region R1, the second region R2 and the transition region RT.

Figure 3D:
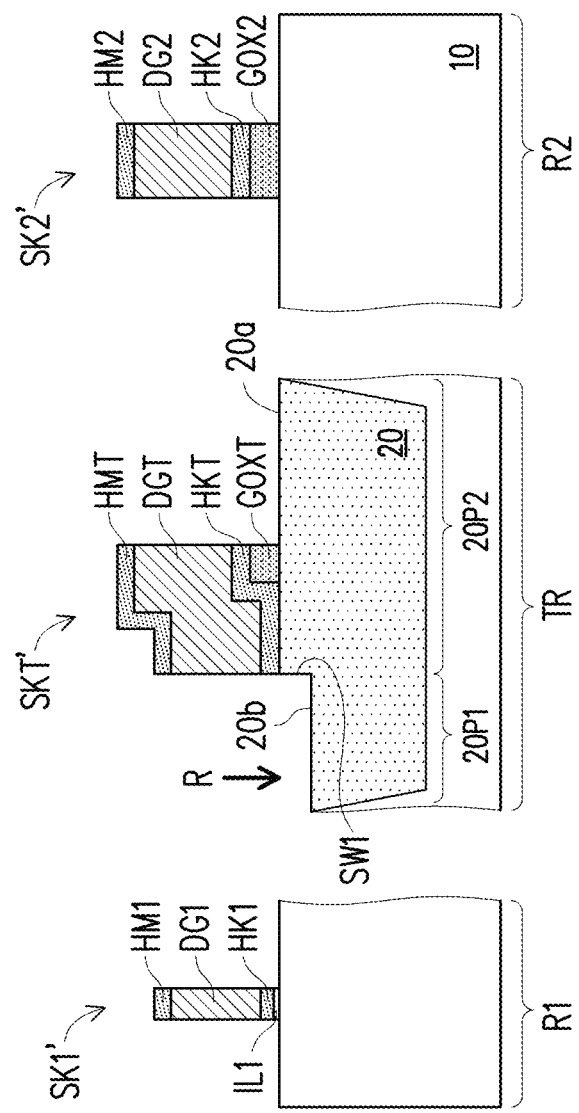

Referring to FIG. 3D, with the mask layer PR2 as a mask, the hard mask layer HM, the sacrificial gate layer DG, the gate dielectric material layer GOX, and the insulating material layer IL are patterned by an etching process to form a dummy stacked structure SKr in the first region R1, a dummy stacked structure SK2' in the second region R2 and a dummy stacked structure SKT' in the transition region TR. The dummy stacked structure SK1' includes an insulating layer IL1, a high-k dielectric layer HK1, a sacrificial gate layer DG1, and a hard mask layer HM1. The dummy stacked structure SK2' includes a gate dielectric layer GOX2, a high-k dielectric layer HK2, a sacrificial gate layer DG2, and a hard mask layer HM2. The dummy stacked structure SKT' includes a gate dielectric layer GOXT, a high-k dielectric layer HKT, a sacrificial gate layer DGT, and a hard mask layer HMT. The etching process may be anisotropic etching, isotropic etching, or a combination thereof.

Because the total thickness t1 of the stacked layers on the isolation SR1 of the isolation structure 20 is smaller than the total thickness t2 of the stacked layers on the isolation SR2 of the isolation structure 20, and the isolation structure 20 and the gate dielectric layer GOX1 made of silicon oxide and have similar etching characteristic in some embodiments. Therefore, when the gate dielectric layer GOX1 on the second region R2 and the portion SR2 of the isolation structure 20 is etched, the isolation structure 20 not covered by the mask pattern PT is also etched to form a recess R, so that the isolation structure 20 includes a portion 20P1 and a portion 20P2. A surface 20b of the portion 20P1 is lower than the surface 20a of the portion 20P2, and a sidewall SW1 of the portion 20P2 are exposed. The surface 20b, the sidewall SW1, and the top surface 20a form a step. After that, the mask layer PR2 may be removed by an acceptable ashing or stripping process, such as using an oxygen plasma or the like, for example.

Figure 3E:
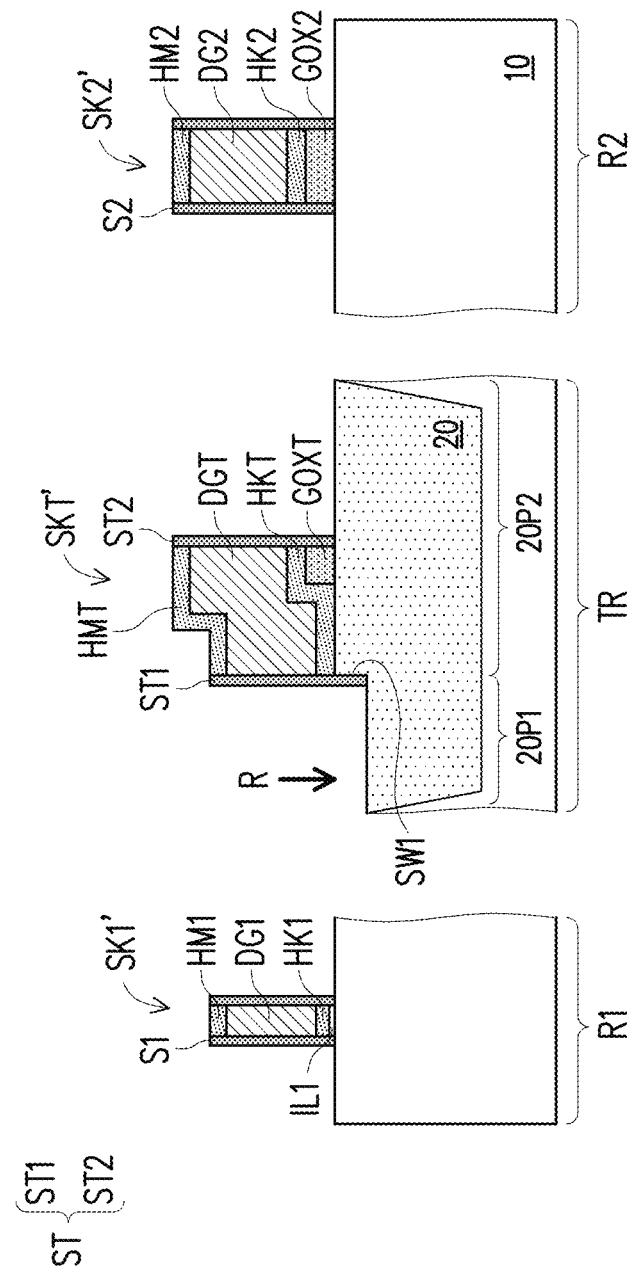

Referring to FIG. 3E, seal liners S1 are formed on sidewalls of the dummy stacked structure SK1' in the first region R1, seal liners S2 are formed on sidewalls of the dummy stacked structure SK2' in the second region R2, and seal liners ST are formed on sidewalls of the dummy stacked liner SKT' and the sidewall SW1 of the portion 20P2 of the isolation structure 20 in the transition region TR. In some embodiments, the formation methods of the seal liners S1, S2, and ST are formed as follows. A sealing layer is formed on the substrate 10. The sealing layer is, for example, conformally covering the substrate 10 and the dummy stacked structure SK1' in the first region R1, the isolation structure 20 and the dummy stacked structure SKT' in the transition region TR, and the substrate 10 and the dummy stacked structure SK2' in the second region R2. The sealing layer and the high-k dielectric layer HK have different materials. The sealing layer may be a single layer or multiple layers. The material of the sealing layer is, for example, silicon nitride (SiN), silicon oxynitride (SiON), silicon oxide (SiO), silicon carbide (SiC), silicon carbonitride (SiCN), silicon carbon oxynitride (SiCON), or a combination thereof. The method for forming the sealing layer is, for example, CVD, FCVD, PVD, ALD, or a combination thereof. Then, an anisotropic etching process is performed on the sealing layer to form the seal liners S1 in the first region R1, the seal liners S2 in the second region R2, and the seal liners ST in the transition region TR.

The seal liners S1 in the first region R1 is located on sidewalls of the dummy stacked structure SK1' to cover sidewalls of the insulating layer IL1, the high-k dielectric layer HK1, the sacrificial gate layer DG1, and the hard mask layer HM1. The seal liners S2 in the second region R2 is located on a sidewall of the dummy stacked structure SK2 to cover sidewalls of the hard mask layer HM2, the sacrificial gate layer DG2, the high-k dielectric layer HK2, and the gate dielectric layer GOX2. The seal liners ST in the transition region TR include a seal liner ST1 and a seal liner ST2. The seal liner ST1 is located on a sidewall of the dummy stacked structure SKT' near the first region R1 and on the sidewall SW1 of the portion 20P2 of the isolation structure 20 to cover sidewalls of the hard mask layer HMT, the sacrificial gate layer DGT, the high-k dielectric layer HKT, and the sidewall SW1 of the isolation structure 20. The seal liner ST2 is located on another sidewall of the dummy stacked structure SKT' near the second region R2 to cover sidewalls of the hard mask layer HMT, the sacrificial gate layer DGT, the high-k dielectric layer HKT, and the gate dielectric layer GOXT. In other words, the high-k dielectric layer HK1 in the first region R1 is covered with the seal liner S1 and the sacrificial gate layer DG1. The high-k dielectric layer HK2 in the second region R2 is covered with the seal liner S2 and the sacrificial gate layer DG2. The high-k dielectric layer HKT in the transition region TR is covered with the seal liner ST1 and ST2 and the sacrificial gate layer DGT. Since the high-k dielectric layer HKT are sealed by the seal liners ST, and the sacrificial gate layers DGT, the contamination issues caused by high-k dielectric residues in the transition region TR in subsequent processes can be avoided.

Figure 3F:
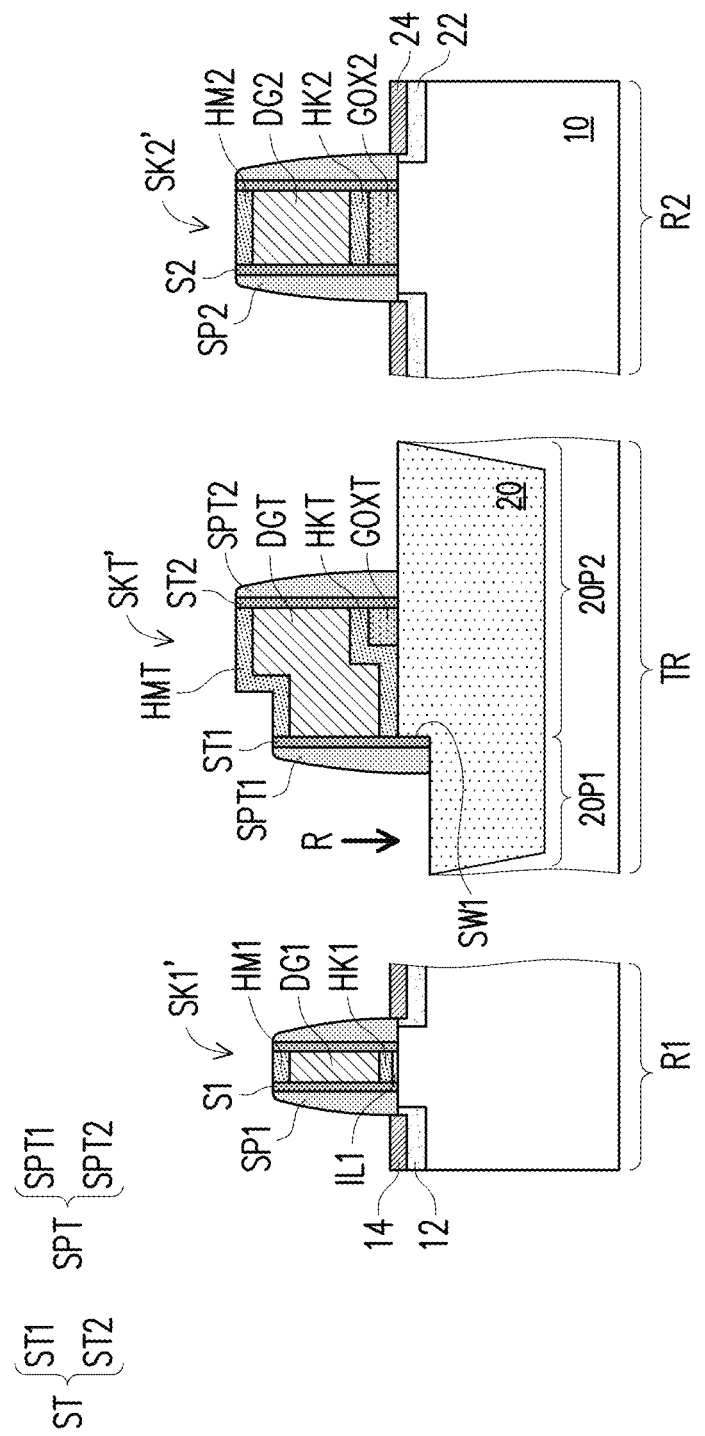

Referring to FIG. 3F, spacers SP1, SP2, and SPT are respectively formed on sidewalls of the seal liners S1, S2, and ST. The spacer SPT in the transition region TR includes a spacer SPT1 and a spacer SPT2. The spacer SPT1 is located on the sidewall of seal liner ST1. The spacer SPT2 is located on the sidewall of the seal liner ST2. In some embodiments, the spacer SP1, SP2, and SPT is formed according to the following method. A spacer layer is conformally formed over the substrate 10. The spacer layer may be a single layer or multiple layers. A material of the spacer layer is, for example, silicon nitride (SiN), silicon oxynitride (SiON), silicon oxide (SiO), silicon carbide (SiC), silicon carbonitride (SiCN), silicon carbon oxynitride (SiCON), or a combination thereof. The spacer layer is formed by, for example, chemical vapor deposition (CVD), FCVD, physical vapor deposition (PVD), atomic layer deposition (ALD), or a combination thereof. After that, an isotropic etching process is performed on the spacer layer to form the spacers SP1 in the first region R1, the spacers SP2 in the second region R2, and spacers SPT in the transition region TR.

Referring to FIG. 3F, doped regions 12 are formed in the substrate 10 in the first region R1, and doped regions 22 are formed in the substrate 10 in the second region R2. The doped regions 12 and the doped regions 22 may be performed by, for example, an ion implantation process. Each of the doped regions 12 and the doped regions 22 may be served as the source and drain regions. The doped regions 12 and the doped regions 22 may include p-type dopant material for p-type transistors, such as boron, aluminum, gallium, indium, or the like, or n-type dopant material n-type transistors, such as phosphorus, arsenic, antimony, bismuth, lithium or the like.

Figure 3G:
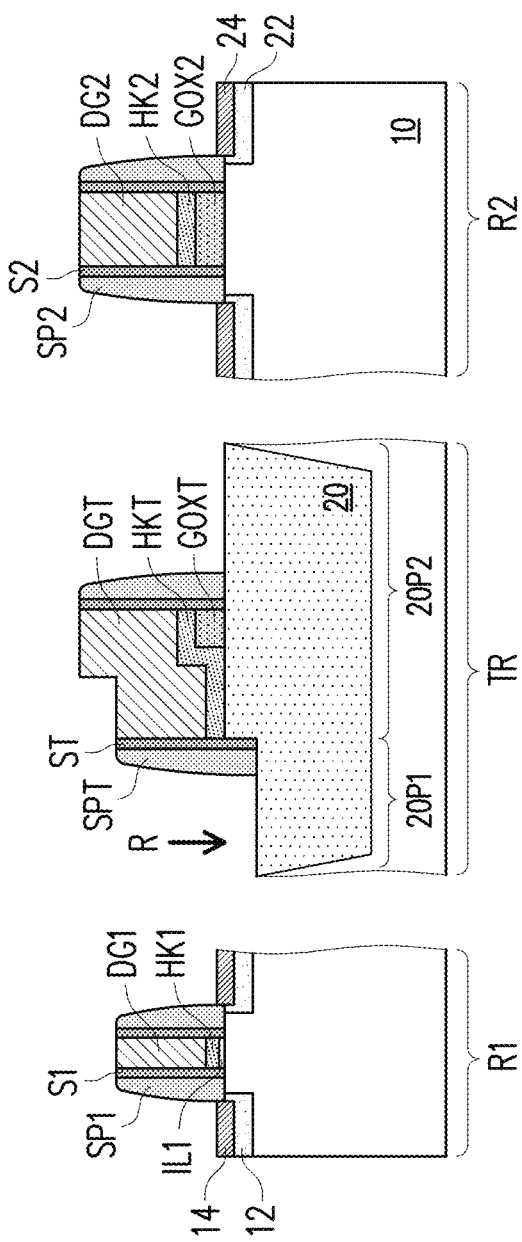

Referring to FIGS. 3F and 3G, metal silicide layers 14 are formed on the doped regions 12 in the first region R1 and metal silicide layers 24 are formed on the doped regions 22 in the second region R2. In some embodiments, the metal silicide layers 14 and 24 are formed according to the following method. A metal layer is formed on the substrate 10, such as titanium, molybdenum, cobalt, nickel, platinum, or tungsten formed by CVD, PVD, or a combination thereof. Next, a salicidation process is performed through an annealing process so that the metal in the metal layer reacts with the silicon in the substrate 10. The unreacted metal layer is removed by an etching process. After that, the hard mask layers HM1, HM2, and HMK are removed by an etching process. The etching process may be anisotropic etching, isotropic etching, or a combination thereof.

Figure 3H:
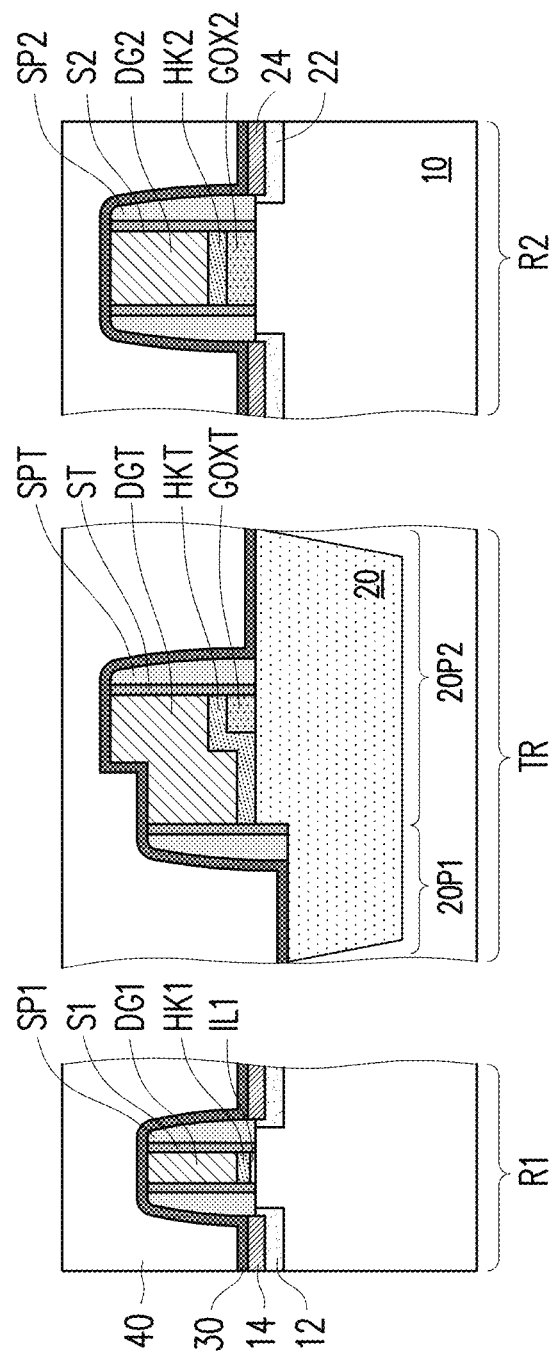

Referring to FIG. 3H, a contact etch stop layer (CESL) 30 and an interlayer dielectric layer 40 are formed on the substrate 10. The contact etch stop layer 30 and the interlayer dielectric layer 40 have different materials. The material of the contact etch stop layer 30 may comprise, for example, silicon nitride, silicon oxynitride, silicon nitride with oxygen (O) or carbon (C) elements, and/or other materials; and may be formed by CVD, PVD, ALD, or other suitable methods. The interlayer dielectric (ILD) layer 40 may be a single layer or multiple layers. The ILD layer 40 may comprise, for example, tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), low-k dielectric material, other suitable dielectric material, or combinations thereof. Low-k dielectric materials include, for example, FSG, carbon doped silicon oxide, Black Diamond® (Applied Materials of Santa Clara, Calif.), Xerogel, Aerogel, amorphous fluorinated carbon, Parylene, BCB, SiLK (Dow Chemical, Midland, Mich.), polyimide, other low-k dielectric material, or combinations thereof. The ILD layer 40 may be formed, for example, by CVD such as PECVD, HDPCVD, MOCVD, RPCVD, LPCVD, ALCVD, APCVD, PVD, ALD, spin-on dielectric, plating, other suitable methods, or combinations thereof. In some implementations, ILD layer 40 are formed by a flowable CVD (FCVD) process that includes, for example, depositing a flowable material (such as a liquid compound) over substrate 10 and converting the flowable material to a solid material by a suitable technique, such as thermal annealing and/or ultraviolet radiation treating.

Figure 3I:
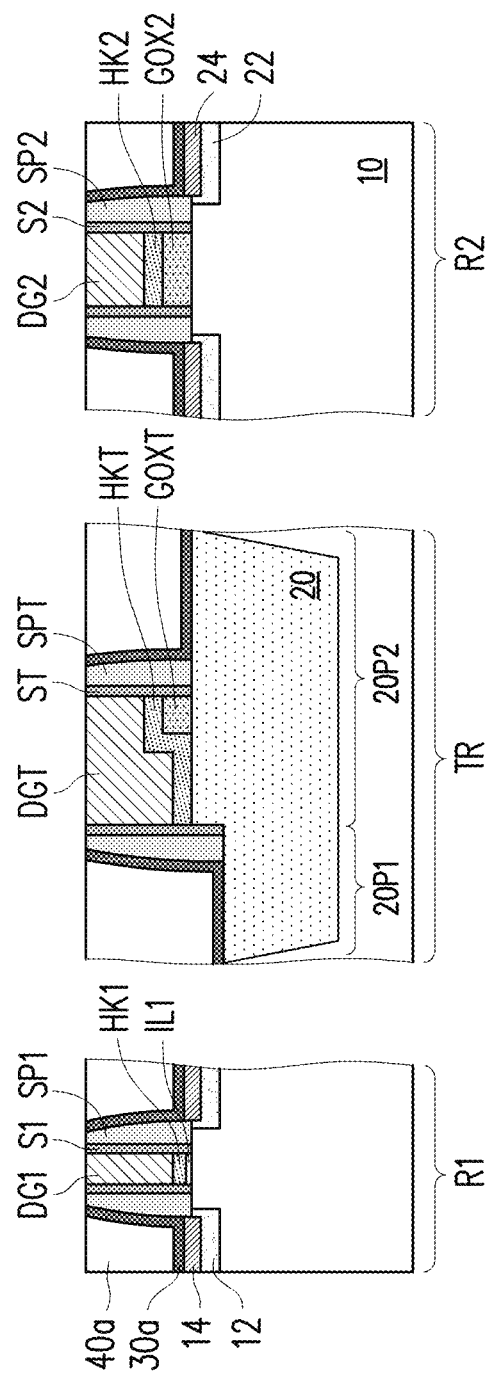

Referring to FIG. 3I, subsequent to the deposition of the ILD layers 40, a CMP process and/or other planarization process is performed on the ILD layers 40 and the contact etch stop layer 30 to form the interlayer dielectric layer 40a and the contact etch stop layer 30a, and expose the sacrificial gate layers DG1, DG3, and DGT.

Figure 3J:
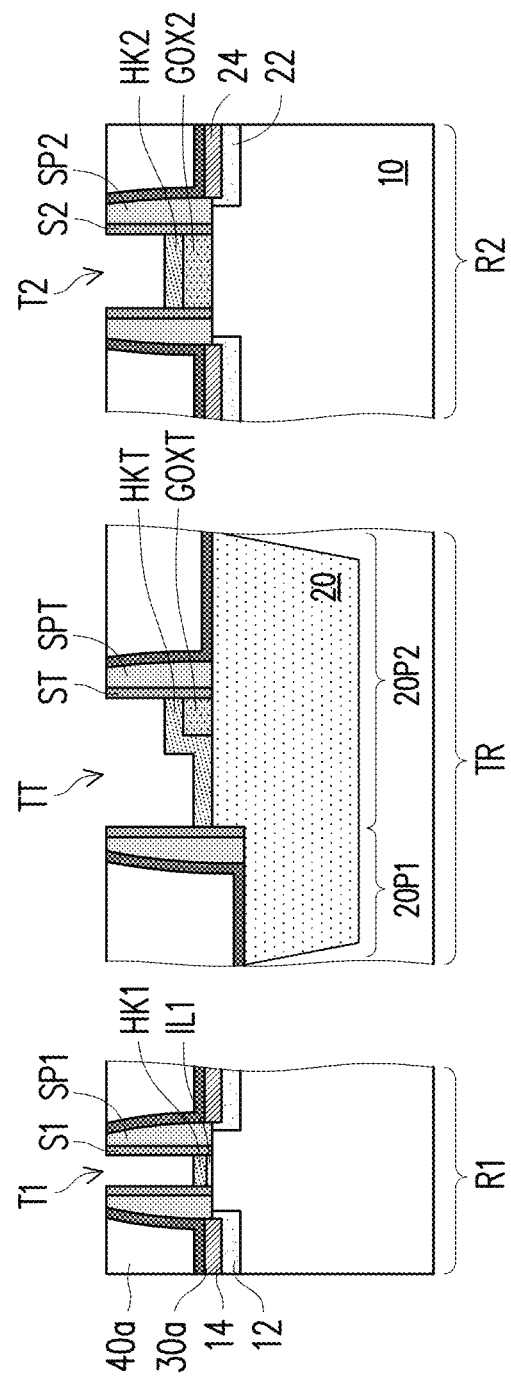

Referring to FIG. 3J, the sacrificial gate layers DG1, DG3, and DGT are removed so as to form a gate trench T1 in a first region R1, a gate trench T2 in a second region R2, and a gate trench TT in a transition region RT. The sacrificial gate layers DG1, DG3, and DGT may be removed using plasma dry etching and/or wet etching. When the sacrificial gate layers DG1, DG3, and DGT are polysilicon and the ILD layer 40 is silicon oxide, a wet etchant may be used to selectively remove the sacrificial gate layers DG1, DG3, and DGT.

Figure 3K:
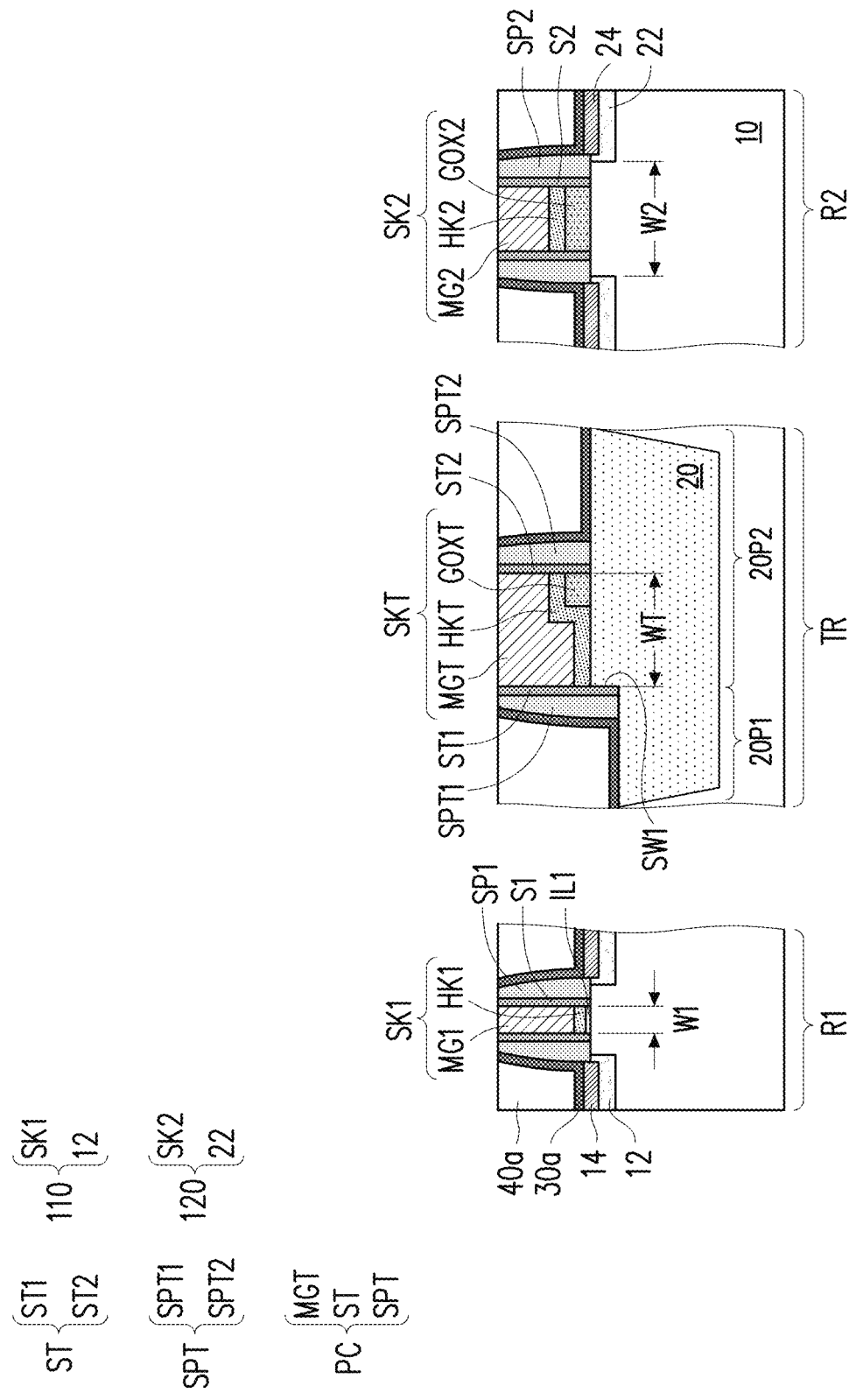

Referring to FIG. 3K, metal gate electrodes MG1, MG2, and MGT are formed in the gate trenches T1, T2, and TT, respectively. The metal gate electrode MG1, MG2, and MGT may be formed by forming a metal gate electrode layer on the interlayer dielectric layer 40a and filling it in the gate trenches T1, T2, and TT. Then, a planarization process, such as a chemical mechanical polishing process, is performed to remove metal gate electrode layers other than the gate trenches T1, T2, and TT. In some embodiments, top surfaces of metal gate electrode MG1, MG2 and MGT, top surfaces of seal liner S1, S2, ST, top surfaces of spacer SP1, SP2 and SPT, top surfaces of contact etch stop layer 30a, and the top surface of interlayer dielectric layer 40a are coplanar.

Each of the metal gate electrodes MG1, MG2, and MGT may include a work function layer and a gate fill material sequentially on the high-k dielectric layer in some embodiments. The work function layer is made of a conductive material such as a single layer of TiN, TaN, TaAlC, TiC, TaC, Co, Al, TiAl, HfTi, TiSi, TaSi or TiAlC, or a multilayer of two or more of these materials. In some embodiments, for the n-channel FET, one or more of TaN, TaAlC, TiN, TiC, Co, TiAl, TiAlC, HfTi, TiSi and TaSi is used as the work function layer, and for the p-channel FET, one or more of TiAlC, Al, TiAl, TaN, TaAlC, TiN, TiC and Co is used as the work function layer. The work function layers may be formed by ALD, PVD, CVD, e-beam evaporation, or other suitable process. The gate fill material disposed on the glue layer may be formed by a conductive material such as W, TiN, TaN, WN, Re, Ir, Ru, Mo, Al, Cu, Co, Ni, combinations thereof, and/or other suitable compositions. The gate fill material may be formed by ALD, PVD, CVD, e-beam evaporation, or other suitable process.

The metal gate electrodes MG1, MG2, or MGT may further include a barrier layer and a glue layer between the work function layer and the gate fill material in other some embodiments. The barrier layer is formed on the work function layer, and is made of a conductive material including a single layer or a multilayer. In some embodiments, the barrier layer includes a nitride of metal such as TiN, TaN, or Si-doped TiN (TSN), of two or more of these materials. The barrier layer may be formed by ALD, PVD, CVD, e-beam evaporation, or other suitable process. The glue layer is formed on the barrier layer, and include TiN or similar material. In some embodiments, the material of the glue layer may have desirable affinity to the material of the gate fill material, such that the gate fill material may be firmly adhered to the glue layer.

The metal gate electrode MG1 and the high-k dielectric layer HK1 in the first region R1 form a stacked structure SK1. The stacked structure SK1 and the doped region 12 form a first device 110 in the second region R2. The metal gate electrode MG2, the high-k dielectric layer HK2, and the gate dielectric layer GOX2 in the second region R2 form a stacked structure SK2 in the second region R2. The stacked structure SK2 and the doped region 22 form a first device 120. The metal gate electrode MGT, high-k dielectric layer HKT, and gate dielectric layer GOXT in the transition region RT form a stacked structure SKT in the transition region RT. The metal gate electrode MGT, the seal liner ST, and the spacer SPT forms a protection cap PC in the transition region RT.

The gate dielectric layer GOXT in the transition region RT and the gate dielectric layer GOX2 have a same thickness. The high-k dielectric layers HK1, HK2 and HKT have a same thickness. A width WT of the stacked structure SKT in the transition region RT is greater than or equal to a width W2 of the stacked structure SK2 in the second region R2, and the width W2 of the stacked structure SK2 in the second region R2 is greater than a width W1 of the stacked structure SK1 in the first region R1. In some embodiments, a ratio of the width WT of the stacked structure SKT to the width W1 of the stacked structure SK1 is, for example, 2 to 3, or more.

Figure 3L:
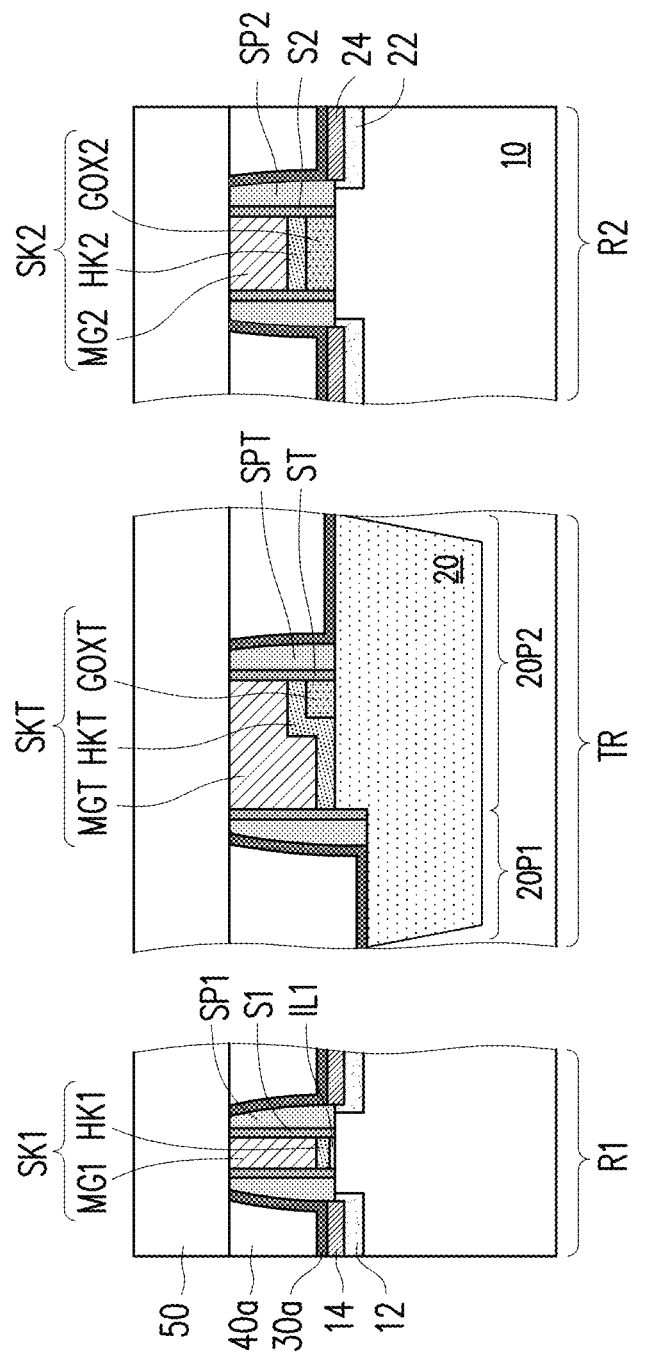

Referring to FIG. 3L, an ILD layer 50 is formed on the substrate 10. The dielectric layer 50 may be a single layer or multiple layers. The ILD layer 50 may comprise, for example, tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), low-k dielectric material, other suitable dielectric material, or combinations thereof. Low-k dielectric materials include, for example, FSG, carbon doped silicon oxide, Black Diamond® (Applied Materials of Santa Clara, Calif.), Xerogel, Aerogel, amorphous fluorinated carbon, Parylene, BCB, SiLK (Dow Chemical, Midland, Mich.), polyimide, other low-k dielectric material, or combinations thereof. The ILD layer 40 may be formed, for example, by CVD such as PECVD, HDPCVD, MOCVD, RPCVD, LPCVD, ALCVD, APCVD, PVD, ALD, spin-on dielectric, plating, other suitable methods, or combinations thereof. In some implementations, the ILD layer 50 are formed by a flowable CVD (FCVD) process that includes, for example, depositing a flowable material (such as a liquid compound) over substrate 10 and converting the flowable material to a solid material by a suitable technique, such as thermal annealing and/or ultraviolet radiation treating. Subsequent to the deposition of the ILD layers 50, a CMP process and/or other planarization process is performed, such that the ILD layers 50 has a substantially planar surface.

Figure 3M:
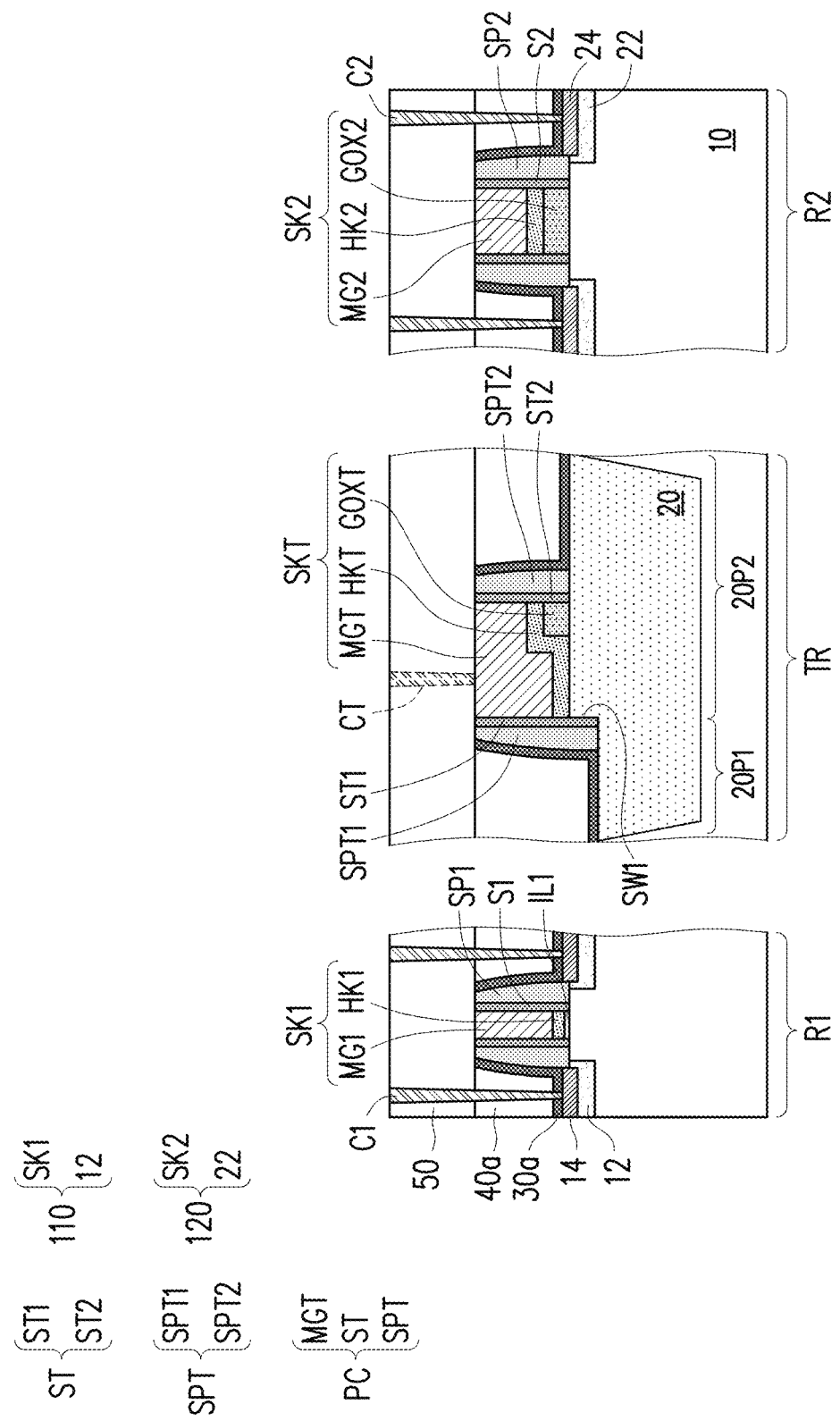

Referring to FIG. 3M, contact C1 and C2 are formed in the dielectric layers 50, 40a and the stop layer 30a. The contact C1 is located in the first region R1 and is electrically connected to the metal silicide layer 14. The contact C2 is located in the second region R2 and is electrically connected to the metal silicide layer 24. More contacts may be included in the first region R1 and the second region R2, which are in contact with the metal gate electrode MG1 and MG2, respectively. In some embodiments, no contact is formed on the stacked structure SKT to be electrically connected to the metal gate electrode MGT. In other some embodiments, a contact CT is formed in the dielectric layer 50 on the stacked structure SKT to electrically connect to the metal gate electrode MGT. The contact CT may be applied with a voltage of 0 volt or floating. In some embodiments, the contact C1, C2 and CT are formed as the following method. Contact openings are formed in the dielectric layers 50, 40a and the stop layer 30a through a photography and etching process. A barrier material layer and a metal material layer are formed on the substrate 10 to completely fill the contact openings. The barrier material layer may be a single layer or a double layer. The material of the barrier material layer includes metal, metal nitride, or a combination thereof. The barrier material layer is, for example, tantalum, titanium, tantalum nitride, titanium nitride, or other suitable materials formed by physical vapor deposition, chemical vapor deposition, or a combination thereof. The metal material layer includes, for example, tungsten, copper, or other suitable materials formed by physical vapor deposition, chemical vapor deposition, or a combination thereof. Next, the barrier material layer and the metal material layer on the dielectric layer 50 are removed. The removal of the barrier material layer and the metal material layer on the dielectric layer 50 may be performed by an etch back process or a chemical mechanical polishing process (CMP).

In the present embodiment, the high-k dielectric layer is sealed by the seal liners and the sacrificial gate layers, and the thus contamination issues caused by high-k dielectric residues in the transition region TR in subsequent processes can be avoided. Therefore, the reliability and performance of the semiconductor device can be improved. In addition, the method of the present embodiment is compatible with the high-K metal get a process and does not require an additional mask to avoid the contamination issues of high-k dielectric residues.

In accordance with some embodiments of the disclosure, a semiconductor device may comprise a semiconductor device, comprising: a substrate comprising a first region, a second region, and a transition region located between the first region and the second region; an isolation structure, located in the transition region; a gate dielectric layer, located on the isolation structure; a high-k dielectric layer, located on the isolation structure and extended to cover a sidewall and a surface of the gate dielectric layer; and a protection cap, located on a surface and sidewalls of the high-k dielectric layer.

In accordance with some embodiments of the disclosure, a semiconductor device may comprise a semiconductor device, comprising: a substrate, comprising a first region, a second region, and a transition region located between the first region and the second region; an isolation structure, located in the transition region; a first stacked structure, located in the first region; a second stacked structure, located in the second region; a third stacked structure, located on the isolation structure in the transition region; and a plurality of seal liners located on sidewalls of the first stacked structure, the second stacked structure, and the third stacked structure to seal each high-k dielectric layer of the first stacked structure, the second stacked structure, and the third stacked structure.

In accordance with some embodiments of the disclosure, a semiconductor device may comprise method for manufacturing a semiconductor device, comprising: providing a substrate, wherein the substrate comprises a first region, a second region, and a transition region located between the first region and the second region; forming an isolation structure in the transition region; forming a first stacked structure in the first region, a second stacked structure in the second region, and a third stacked structure on the isolation structure in the transition region; and forming a plurality of seal liners on sidewalls of the first stacked structure, the second stacked structure, and the third stacked structure to seal sidewalls of high-k dielectric layers of the first stacked structure, the second stacked structure, and the third stacked structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a substrate comprising a first region, a second region, and a transition region located between the first region and the second region;
an isolation structure, located in the transition region;
a gate dielectric layer, located on the isolation structure;
a high-k dielectric layer, located on the isolation structure and extended to cover a sidewall and a top surface of the gate dielectric layer; and
a protection cap, comprising a metal gate electrode, wherein the metal gate electrode is located on and in contact with a top surface and a sidewall of the high-k dielectric layer,
wherein a dielectric constant of the high-k dielectric layer is greater than a dielectric constant of the gate dielectric layer.

2. The semiconductor device of claim 1, wherein the gate dielectric layer and the high-k dielectric layer and are in physical contact with the isolation structure.

3. The semiconductor device of claim 1, wherein the protection cap is a ring.

4. The semiconductor device of claim 1, wherein a plurality of seal liners are located on sidewalls of the stacked structure.

5. The semiconductor device of claim 4, wherein the isolation structure comprises a first portion and a second portion, the second portion protrudes from a top surface of the first portion and a sidewall of the second portion is exposed, and the stacked structure is disposed on the second portion.

6. The semiconductor device of claim 5, wherein the seal liners comprise a first seal liner and a second seal liner, the second seal liner covers a sidewall of the stacked structure, and the first seal liner covers another sidewall of the stacked structure and further covers the sidewall of the second portion of the isolation structure.

7. The semiconductor device of claim 5, further comprising a plurality of spacers located on the sidewalls of the plurality of seal liners.

8. The semiconductor device of claim 5, further comprising a contact etch stop layer covering a surface of the isolation structure and sidewalls of the plurality of spacers.

9. The semiconductor device of claim 1, wherein the transition region is free from any active region, and the high-k dielectric layer comprises metal oxide.

10. A semiconductor device, comprising:
a substrate comprising a first region, a second region, and a transition region located between the first region and the second region;
an isolation structure, located in the transition region, wherein the isolation structure comprises a first portion and a second portion, the second portion protrudes from a top surface of the first portion and a sidewall of the second portion is exposed; and
a stacked structure on the second portion of the isolation structure in the transition region, wherein the stacked gate structure comprises:
a gate dielectric layer, located on the isolation structure;
a high-k dielectric layer, located on the isolation structure and extended to cover a sidewall and a surface of the gate dielectric layer; and
a protection cap, comprising a metal gate electrode located on the high-k dielectric layer,
wherein a sidewall of the high-k dielectric layer and a sidewall of the metal gate electrode are flushed with the exposed sidewall of the second portion of the isolation structure.

11. The semiconductor device of claim 10, further comprising a plurality of seal liners on sidewalls of the stacked structure on the isolation region in the transition region.

12. The semiconductor device of claim 10, further comprising:
a first stacked structure, located in the first region; and
a second stacked structure, located in the second region.

13. The semiconductor device of claim 12, wherein a width of the high-k dielectric layer of the stacked structure in the transition region is greater than a width of a high-k dielectric layer of the first stacked structure.

14. The semiconductor device of claim 12, wherein a thickness of the gate dielectric layer of the stacked structure is greater than a thickness of a first gate dielectric layer of the first stacked structure.

15. The semiconductor device of claim 12, wherein a thickness of the gate dielectric layer of the stacked structure is equal to a thickness of a second gate dielectric layer of the second stacked structure.

16. The semiconductor device of claim 10, wherein the transition region is free from any active region, and the stacked structure does not cover any active region in the substrate.

17. A method for manufacturing a semiconductor device, comprising:
providing a substrate, wherein the substrate comprises a first region, a second region, and a transition region located between the first region and the second region;
forming an isolation structure in the transition region, wherein the isolation structure comprises a first portion and a second portion, the second portion protrudes from a top surface of the first portion and a sidewall of the second portion is exposed; and
forming a stacked structure on the second portion of the isolation structure in the transition region, wherein the stacked gate structure comprises:
a gate dielectric layer, located on the isolation structure;
a high-k dielectric layer, located on the isolation structure and extended to cover a sidewall and a surface of the gate dielectric layer; and
a protection cap, comprising a metal gate electrode located on the high-k dielectric layer,
wherein a sidewall of the high-k dielectric layer and a sidewall of the metal gate electrode are flushed with the exposed sidewall of the second portion of the isolation structure.

18. The method of claim 17, further comprising forming a first stacked structure and a second stacked structure in the first region and the second region, wherein the first stacked structure, the second stacked structure, and the third stacked structure are formed simultaneously.

19. The method of claim 17, further comprising forming a plurality of seal liners on sidewalls of the first stacked structure in the first region, on sidewalls of the second stacked structure in the second region, and on sidewalls of the stacked structure on the isolation structure in the transition region.

20. The method of claim 19, wherein the plurality of the seal liners comprise silicon nitride (SiN), silicon oxynitride (SiON), silicon oxide (SiO), silicon carbide (SiC), silicon carbonitride (SiCN), silicon carbon oxynitride (SiCON), or a combination thereof.

* * * * *